US009633998B2

(12) United States Patent
Soloviev et al.

(10) Patent No.: US 9,633,998 B2
(45) Date of Patent: Apr. 25, 2017

(54) SEMICONDUCTOR DEVICE AND METHOD FOR MAKING THE SAME

(75) Inventors: Stanislav Ivanovich Soloviev, Ballston Lake, NY (US); Ahmed Elasser, Latham, NY (US); Alexander Viktorovich Bolotnikov, Niskayuna, NY (US); Alexey Vert, Clifton Park, NY (US); Peter Almern Losee, Starkville, MS (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 496 days.

(21) Appl. No.: 13/613,848

(22) Filed: Sep. 13, 2012

(65) Prior Publication Data
US 2014/0070231 A1    Mar. 13, 2014

(51) Int. Cl.
*H01L 29/15* (2006.01)
*H01L 27/06* (2006.01)
*H01L 27/08* (2006.01)

(52) U.S. Cl.
CPC ...... *H01L 27/0676* (2013.01); *H01L 27/0817* (2013.01)

(58) Field of Classification Search
CPC ............... H01L 27/0676; H01L 27/0817
USPC ............................. 257/115, 107, 77
See application file for complete search history.

(56) References Cited

U.S. PATENT DOCUMENTS

| 3,381,147 | A | * | 4/1968 | Abraham | G01J 1/42 327/514 |
| 4,572,947 | A | * | 2/1986 | Kao et al. | 257/118 |
| 4,914,043 | A | | 4/1990 | Nishizawa et al. | |
| 5,003,369 | A | * | 3/1991 | Kanda | H01L 31/1113 257/157 |
| 5,017,991 | A | | 5/1991 | Nishizawa et al. | |
| 5,243,205 | A | * | 9/1993 | Kitagawa | H01L 21/263 257/107 |
| 5,637,886 | A | * | 6/1997 | Satoh et al. | 257/107 |
| 6,037,613 | A | | 3/2000 | Mariyama | |
| 6,218,682 | B1 | | 4/2001 | Zucker et al. | |
| 7,989,841 | B1 | * | 8/2011 | Bratkovski | H01L 31/1113 257/107 |
| 8,399,848 | B2 | * | 3/2013 | Frach | G01T 1/1642 250/370.11 |
| 9,069,060 | B1 | * | 6/2015 | Zbrozek | G01S 7/481 |
| 9,209,320 | B1 | * | 12/2015 | Webster | H01L 31/02027 |

(Continued)

OTHER PUBLICATIONS

Jin-Wei Shi et al.,"Design and Analysis of Separate-Absorption-Transport-Charge-Multiplication Traveling-Wave Avalanche Photodetectors," Journal of Lightwave Technology, vol. 22, No. 6, Jun. 2004, pp. 1583-1590.

(Continued)

*Primary Examiner* — Bac Au
*Assistant Examiner* — Sophia Nguyen
(74) *Attorney, Agent, or Firm* — John P. Darling

(57) ABSTRACT

A semiconductor device is provided. The semiconductor device includes an avalanche photodiode unit and a thyristor unit. The avalanche photodiode unit is configured to receive incident light to generate a trigger current and comprises a wide band-gap semiconductor. The thyristor unit is configured to be activated by the trigger current to an electrically conductive state. A semiconductor device and a method for making a semiconductor device are also presented.

25 Claims, 5 Drawing Sheets

(56) References Cited

U.S. PATENT DOCUMENTS

| | | | |
|---|---|---|---|
| 2002/0022306 A1* | 2/2002 | Schulze | H01L 21/263 438/133 |
| 2002/0145107 A1* | 10/2002 | Deschamps | H01J 40/14 250/214 R |
| 2005/0001332 A1* | 1/2005 | Giorgi | G02B 6/4204 257/118 |
| 2005/0263787 A1* | 12/2005 | Ishimura | H01L 31/107 257/186 |
| 2006/0261346 A1 | 11/2006 | Ryu et al. | |
| 2007/0029485 A1 | 2/2007 | Beck et al. | |
| 2008/0309379 A1* | 12/2008 | Carroll | H03K 5/1536 327/79 |
| 2010/0117188 A1* | 5/2010 | Waldrab et al. | 257/506 |
| 2011/0025135 A1 | 2/2011 | Sheu | |
| 2012/0098029 A1* | 4/2012 | Mazumder | 257/115 |
| 2012/0261583 A1* | 10/2012 | Watson | H04N 5/32 250/369 |
| 2015/0207015 A1* | 7/2015 | Nunnally | H01L 31/1113 250/214 SW |
| 2016/0099371 A1* | 4/2016 | Webster | H01L 31/1075 250/208.1 |

OTHER PUBLICATIONS

Alexey Vert et al., "Optically triggered semiconductor device and method for making the same," U.S. Appl. No. 13/328,796, filed Dec. 16, 2011.

\* cited by examiner

SEMICONDUCTOR DEVICE AND METHOD FOR MAKING THE SAME

BACKGROUND OF THE DISCLOSURE

This invention relates generally to semiconductor devices and methods for making the same. More particularly, this invention relates to optically triggered semiconductor devices employing thyristor devices and methods for making the same.

Thyristor devices, such as silicon controlled rectifiers (SCRs) have been widely used as switching devices in a variety of applications, such as motor controls, home appliances, power converters, and light dimmers due to their fast response time, regenerative action and low resistance thereof once triggered. Typically, the thyristor devices are used as power semiconductor switches that permit large electrical currents to be switched at high voltages.

Normally, the thyristor devices are triggered to be electrically conductive by applying a trigger current to their gate terminals, while the anode and cathode terminals thereof are forward biased. Once triggered, the gate trigger current may be removed without turning off the thyristor devices. The thyristor devices become low-impedance current paths and remain in the conductive state until an electric current flowing between the anode and cathode terminals is reduced below a minimum value called the holding current. Alternatively, the anode and cathode terminals may be reverse biased to turn off the thyristor devices.

There have been various ways to trigger the thyristor devices through the gate terminals thereof. For optically triggered thyristors, an incident light is applied to a thyristor device to generate a trigger current through by means of the photoelectric effect to trigger the thyristor device. Using incident light to trigger thyristor devices for high voltage applications is advantageous because the incident light can be isolated from the anode and cathode terminals of the thyristor devices.

However, some high voltage applications require that the electric current between the anode and cathode terminals of the thyristor devices be high. As a result, an optically generated trigger current may not be large enough to trigger such thyristor devices. This can limit the use of such thyristor devices to low voltage and current applications.

Therefore, there is a need for new and improved optically triggered semiconductor devices employing the thyristor devices and methods for making the same, so that the thyristor devices can operate in high voltage and/or high current applications.

BRIEF DESCRIPTION

A semiconductor device is provided, in accordance with one aspect of the invention. The semiconductor device includes an avalanche photodiode unit and a thyristor unit. The avalanche photodiode unit is configured to receive incident light to generate a trigger current and comprises a wide band-gap semiconductor. The thyristor unit is configured to be activated by the trigger current to an electrically conductive state.

A semiconductor device is provided, in accordance with another aspect of the invention. The semiconductor device includes a wide band-gap semiconductor body. The wide band-gap semiconductor body includes an avalanche photodiode unit and a thyristor unit. The avalanche photodiode unit is configured to receive incident light to generate a trigger current. The thyristor unit is configured to receive and be activated by the trigger current to an electrically conductive state. The avalanche photodiode unit and the thyristor unit are integrally formed on the wide band-gap semiconductor body. The semiconductor unit further includes an anode and a cathode conductively coupled to the wide band-gap semiconductor body, so that an electrical connection is provided between the anode and the cathode when the thyristor unit is in the electrically conductive state.

A method for making a semiconductor device is also provided, in accordance with yet another aspect of the invention. The method includes providing a wide band-gap semiconductor body comprising four doped wide band-gap semiconductor layers each oppositely doped from an adjacent one of the doped wide band-gap semiconductor layers, defining an avalanche photodiode unit and a thyristor unit on the wide band-gap semiconductor body, and conductively coupling an anode and a cathode to respective ones of first and fourth doped wide band-gap semiconductor layers.

BRIEF DESCRIPTION OF THE DRAWINGS

The above and other aspects, features, and advantages of the present disclosure will become more apparent in light of the following detailed description when taken in conjunction with the accompanying drawings in which.

DETAILED DESCRIPTION OF THE INVENTION

Preferred embodiments of the present disclosure will be described hereinbelow with reference to the accompanying drawings. In the following description, well-known functions or constructions are not described in detail to avoid obscuring the disclosure in unnecessary detail.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The modifier "about" used in connection with a quantity is inclusive of the stated value, and has the meaning dictated by context, (e.g., includes the degree of error associated with measurement of the particular quantity).

Moreover, in this specification, the suffix "(s)" is usually intended to include both the singular and the plural of the term that it modifies, thereby including one or more of that term (e.g., "the element" may include one or more elements, unless otherwise specified). Reference throughout the specification to "one embodiment," "another embodiment," "an embodiment," and so forth, means that a particular element (e.g., feature, structure, and/or characteristic) described in connection with the embodiment is included in at least one embodiment described herein, and may or may not be present in other embodiments. Similarly, reference to "a particular configuration" means that a particular element (e.g., feature, structure, and/or characteristic) described in connection with the configuration is included in at least one configuration described herein, and may or may not be present in other configurations. In addition, it is to be understood that the described inventive features may be combined in any suitable manner in the various embodiments and configurations.

In addition, approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In some instances, the approximating language may correspond to the precision of an instrument for measuring the value.

Further, as used herein, the terms "disposed on" and "adjacent" refer to layers disposed directly in contact with each other or indirectly by having intervening layers there between.

Figure 1:
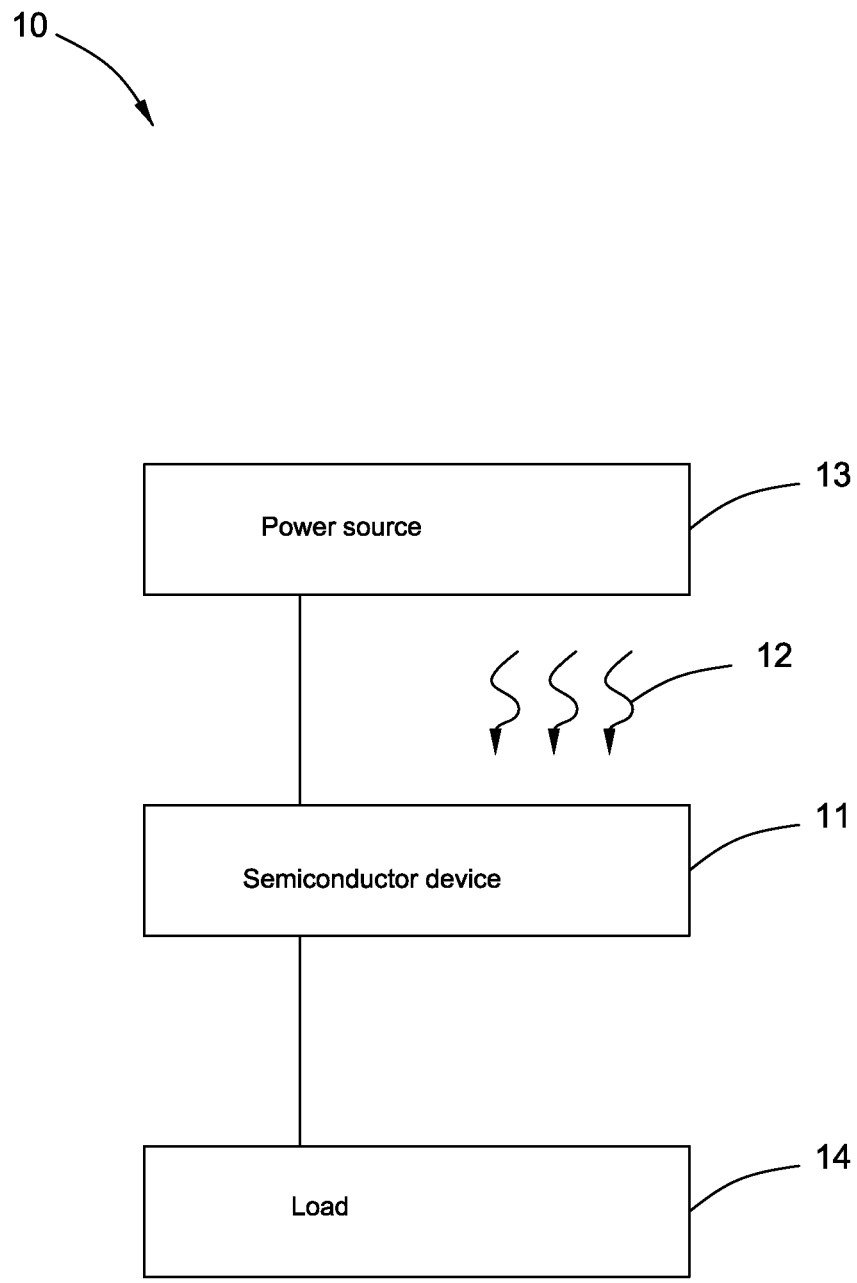
FIG. 1 is a schematic diagram of a switching system employing a semiconductor device, in accordance with aspects of the present invention.

FIG. 1 is a schematic diagram of a switching system 10 employing a semiconductor device 11, in accordance with aspects of the present invention. As illustrated in FIG. 1, the switching system 10 comprises a semiconductor device 11 configured to switch electrical power from an electrical power source 13 to a load 14, such as a power grid or other suitable devices. In non-limiting examples, the electrical power source 13 may apply a high voltage to the semiconductor device 11. Although a single semiconductor device 11 is illustrated, more than one semiconductor device 11 may also be employed depending on the particular application.

In embodiments of the invention, the semiconductor device 11 is an optically triggered semiconductor device. Incident light 12 from a light source (not shown) may be applied to the semiconductor device 11 to generate a trigger current by means of the photoelectric effect to trigger or activate the semiconductor device 11. Non-limiting examples of the light source include light emitting diodes, ultraviolet light sources, or other suitable light sources.

Before it is triggered, the semiconductor device 11 is in a non-conductive state. In this state, an electric current from the power source 13 cannot flow through the semiconductor device 11 to the load 14. Once triggered, the semiconductor device 11 is switched to an electrically conductive state, and the electric current from the power source 13 flows through the semiconductor device 11 to provide an electrical connection between the power source 13 and the load 14.

The trigger current may be removed without turning off the electrical connection between the power source 13 and the load 14. When the electric current from the power source 13 is usually reduced below a minimum value called the holding current, the semiconductor device 11 returns to the non-conductive state to close the electrical connection between the power source 13 and the load 14. It should be noted that the arrangement in FIG. 1 is merely illustrative. In some applications, the switching system 10 may comprise other elements (not shown), such as a control unit for controlling the light source and/or the power source, passive components (e.g. inductors, capacitors), and other semiconductor devices.

Figure 2:
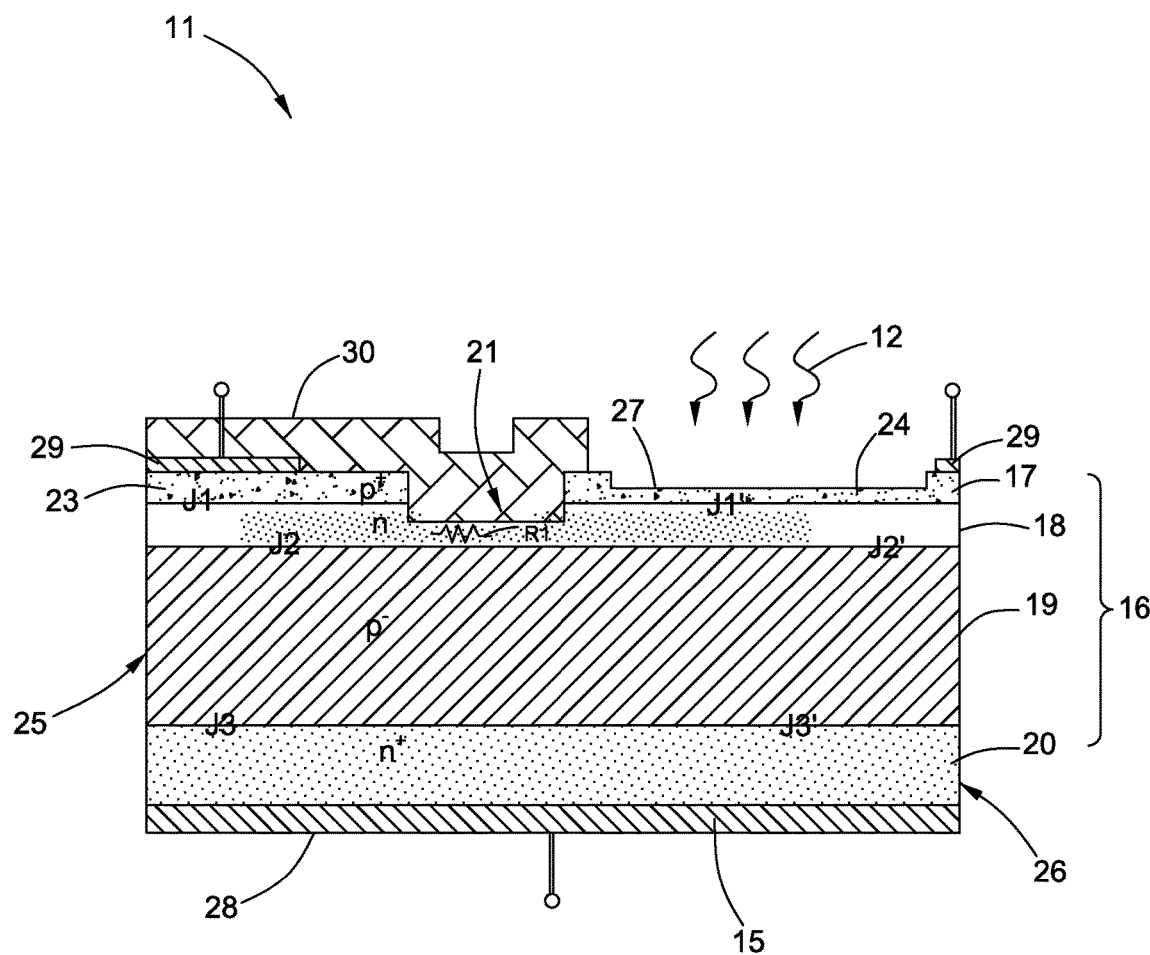
FIG. 2 is a schematic cross sectional diagram of the semiconductor device, in accordance with aspects of the present invention.

FIG. 2 is a schematic cross sectional diagram of the semiconductor device 11, in accordance with aspects of the present invention. As illustrated in FIG. 2, the semiconductor device 11 comprises a semiconductor body 16. The semiconductor body 16 comprises a wide band-gap semiconductor and includes a number of doped wide band-gap semiconductor layers, such as first, second, third, and fourth doped layers 17-20.

For the illustrated arrangement, the second and the third doped wide band-gap semiconductor layers 18, 19 are disposed between the first and the fourth doped wide band-gap semiconductor layers 17, 20. As shown in FIG. 2, the second doped wide band-gap semiconductor layer 18 is disposed between the first and the third doped wide band-gap semiconductor layers 17, 19, and the third doped wide band-gap semiconductor layer 19 is disposed between the second and the fourth doped wide band-gap semiconductor layers 18, 20. In one non-limiting example, the wide band-gap semiconductor body 16 comprises silicon carbide. Alternatively, the wide band-gap semiconductor body 16 may comprise any other suitable wide bandgap material, such as gallium nitride (GaN), gallium phosphide (GaP), or aluminum gallium arsenide (AlGaAs).

In some examples, the first and the third doped layers 17, 19 may be p-doped layers, such as layers doped with a p-type dopant, and the second and the fourth doped layers 18, 20 may be n-type doped layers, such as layers doped with an n-type dopant, such that the wide band-gap semiconductor body 16 has a n-p-n-p structure along a direction from the fourth doped layer 20 to the first doped layer 17. It will be understood by those skilled in the art that "n-type" and "p-type" refer to the majority of charge carriers, which are present in a respective layer. For example, in n-type layers, the majority carriers are electrons, and in p-type layers, the majority carriers are holes (the absence of electrons). In non-limiting examples, the p-type dopant may comprise boron and/or aluminum. The n-type dopant may comprise nitrogen. The first and the fourth doped layers 17, 20 may be more heavily doped than the second and the third layers 18, 19. Alternatively, the first and the third layers 17, 19 may be n-doped layers, and the second and the fourth layers 18, 20 may be p-doped layers, such that the wide band-gap semiconductor body 16 has a p-n-p-n structure along the direction from the fourth doped layer 20 to the first doped layer 17.

For the illustrated arrangement, the first doped layer 17 of the wide band-gap semiconductor body 16 is discontinuous, and a separation slot 21 extends along and divides the first doped layer 17 into first and second portions 23, 24. In the illustrated example, the separation slot 21 extends downward into the second doped layer 18 along the first doped layer 17. Alternatively, the separation slot 21 may not extend into the second doped layer 18.

Thus, the wide band-gap semiconductor body 16 is spatially formed with a first unit 25 and a second unit 26 unitary with the first unit 25 according to the position of the separation slot 21. The first doped layer 17 of the second section 26 also defines a light adsorption region 27 to absorb the incident light 12 from a light source (not labeled). In some embodiments, the first unit 25 may act as a thyristor unit, and the second unit 26 may act as an avalanche photodiode unit. In this example, the avalanche photodiode unit 26 and the thyristor 25 are integrally formed on the wide band-gap semiconductor body.

For the illustrated arrangement, the semiconductor device 11 further comprises a first and a second electrically conductive layer 28, 29, which are typically formed of metal, such as aluminum-titanium-nickel multilayer (for the anode) and nickel (cathode). The first conductive layer 28 is disposed adjacent to a bottom surface 15 of the fourth layer 20. As noted above, by "adjacent," it is meant that the first conductive layer 28 may be disposed directly adjacent to the bottom surface 15 of the fourth layer 20 or there may be intervening layers. What is important is that the first conductive layer 28 be in ohmic contact with the fourth layer 20. The second conductive layer 29 is disposed adjacent (either directly adjacent or via intervening layer(s)) to upper surfaces (not labeled) of the first and the second portions 23, 24 of the first doped layer 17 respectively, such that the second conductive layer 29 is in ohmic contact with the first and the second portions 23, 24 of the first doped layer 17. Depending on particular configuration of the first doped layer 17, the second conductive layer 29 may be disposed on different portions of the first doped layer 17. In some applications, the first and the second conductive layers 28, 29 are configured to act as electrode terminals to electrically connect to the power source 13 and the load 14 (shown in FIG. 1). In one non-limiting example, the first and the second conductive layers 28, 29 act as a cathode and an anode, respectively.

In addition, for the illustrated arrangement, a dielectric layer 30 is disposed on the first portion 23 of the first doped layer 17 to protect the first portion 23. In some examples, the dielectric layer 30 may also be disposed within the separation slot 21 to protect the exposed second doped layer 18 and to electrically insulate the first and the second portions 23, 24 of the first doped layer 17. In other examples, the first conductive layer 28 may also be covered by the dielectric layer 30. In one non-limiting example, the dielectric layer 30 comprises silicon dioxide. Alternatively, the dielectric layer 30 may optionally comprise silicon nitride. An antireflection layer (not labeled) may be optionally disposed on the light absorption region 27 to facilitate absorption of the incident light 12 and protect the second portion 24 of the first doped layer 17.

Thus, in non-limiting examples, during manufacture of the semiconductor device 11, a wide band-gap semiconductor body 16 formed with multiple doped wide band-gap semiconductor layers 17-20 is provided. The thyristor unit 25 and the avalanche photodiode unit 26 are defined on the wide band-gap semiconductor body 16. In one example, the separation slot 21 is defined along the first doped layer 17 to define the avalanche photodiode unit 26 and the thyristor unit 25. The anode(s) 29 and cathode 28 are provided to be conductively coupled to the upper surface(s) of the first layer 17 and the bottom surface of the fourth doped layer 20. In some applications, the sequence of defining the thyristor unit 25 and the avalanche photodiode unit 26, and providing the anode 29 and the cathode 28 may vary. Optionally, the dielectric layer 30 may be also provided.

For some arrangements, the thyristor unit 25 is configured to switch the electrical connection between the power source 13 and the load 14. In one example, as shown in FIGS. 1-2, the anode 29 is electrically connected with the power source 13. The cathode 28 is electrically connected with the load 14. Alternatively, the anode 29 may be electrically connected with the load 14 while the cathode 28 may be electrically connected with the power source 13.

The thyristor unit 25 may be turned on or activated by the trigger current to allow the electric current from the power source 13 to flow to the load 14 while the cathode 28 and the anode 29 thereof are forward biased. In other applications, the thyristor unit 25 may also be switched to the non-conductive state when the electric current from the power source 13 is reduced below the minimum value. Alternatively, the cathode 28 and the anode 29 may be reverse biased to turn off the thyristor unit 25.

As illustrated in FIG. 2, each of the four doped wide band-gap semiconductor layers 17-20 is oppositely doped from the adjacent layer(s), and a number of semiconductor junctions J1, J2, and J3 are formed at interfaces (not labeled) between the first and the second doped layers 17-18, between the second and the third doped layers 18-19, and between the third and the fourth doped layers 19-20 respectively in the thyristor unit 25. In some examples, the trigger current may be injected into the second and/or the third doped layers (or a gate terminal) 18-19 to activate the thyristor unit 25.

The avalanche photodiode unit 26 is configured to generate the trigger current by means of the photoelectric effect to activate the thyristor unit 25 when the incident light 12 is applied to the light absorption region 27 thereof while the avalanche photodiode unit 26 is reverse biased. Similar to the thyristor unit 25, a number of semiconductor junctions J1', J2', and J3' are also formed at the interfaces between the first and the second doped layers 17-18, between the second and the third doped layers 18-19, and between the third and the fourth doped layers 19-20 respectively in the avalanche photodiode unit 26. In the illustrated example, the semiconductor junctions J1', J2', and J3' are the same as the respective semiconductor junctions J1, J2, and J3.

Generally, when an electric field of a magnitude below the avalanche breakdown is applied to the avalanche photodiode unit 26, the injection of carriers (electrons or holes), even in small numbers, may produce a large number of new carriers, resulting in an increase of the electric current. Thus, the amplification is accomplished during the avalanche breakdown, so that a large electric current may be obtained with an injection of a small number of carriers. The avalanche photodiode unit 26 uses photoinduced carriers produced by the optical absorption for the carrier injection that triggers this phenomenon.

Accordingly, for the illustrated arrangement, during operation, the incident light 12 is applied to the light absorption region 27 of the first doped layer 17 to induce the carriers (or a photoinduced electric current) while the semiconductor junction J1' is reverse biased. In non-limiting examples, the incident light 12 may be ultraviolet (UV) light having a wavelength of between about 200 and about 450 nanometers. In one example, the incident light 12 has a wavelength of about 285 nanometers, and the semiconductor body 16 comprises silicon carbide with a photodiode sensitivity of about 0.14 amps per watt (A/W). Different wavelengths and/or energies of the incident light 12 may include different amounts of the carriers in the wide band-gap semiconductor body 16.

The photoinduced carriers may be accelerated by the electrical field applied to the avalanche photodiode unit 26 to flow to the second and/or the third doped layers 18-19 to produce a large number of new carriers, resulting in a large electric current. Such a large electric current from the avalanche photodiode unit 26 acts as the trigger current to flow to the gate terminal (the second and/or the third layers 18-19) of the thyristor unit 25 to activate the thyristor unit 25.

A resistor R1 shown in FIG. 2 may represent an electrical resistance for the trigger current flowing from the second and/or the third layers 18, 19 of the avalanche photodiode unit 26 to the second and/or the third layers 18, 19 of the thyristor unit 25. Once the thyristor unit 25 is triggered, the electric current from the avalanche photodiode unit 26 may be removed, for example by removing the incident light 12.

As mentioned above, in some applications, the thyristor unit 25 may operate in high voltage and/or high current applications. For example, a high electric current is provided to the anode 29 from the power source 13. In such an example, a relatively high trigger current may be needed to be applied to the gate terminal, such as the second and/or the third layers 18, 19 of the thyristor unit 25. In certain applications, such a trigger current may be greater than the photoinduced electric current that would be generated by a conventional optically triggered thyristor.

Thus, beneficially, due to employment of the avalanche photodiode unit 26, the thyristor unit 25 may be readily activated. For example, a photoinduced electric current generated by a conventional optically triggered thyristor may be about 0.016 amps for triggering such a conventional optically triggered thyristor. The avalanche photodiode unit 26 may amplify this electric current to about 160 amps, which is about 10,000 times the photoinduced current, to switch the thyristor unit 25 to the electrically conductive state. This beneficially increases the applications of the thyristor unit 25.

Figure 3:
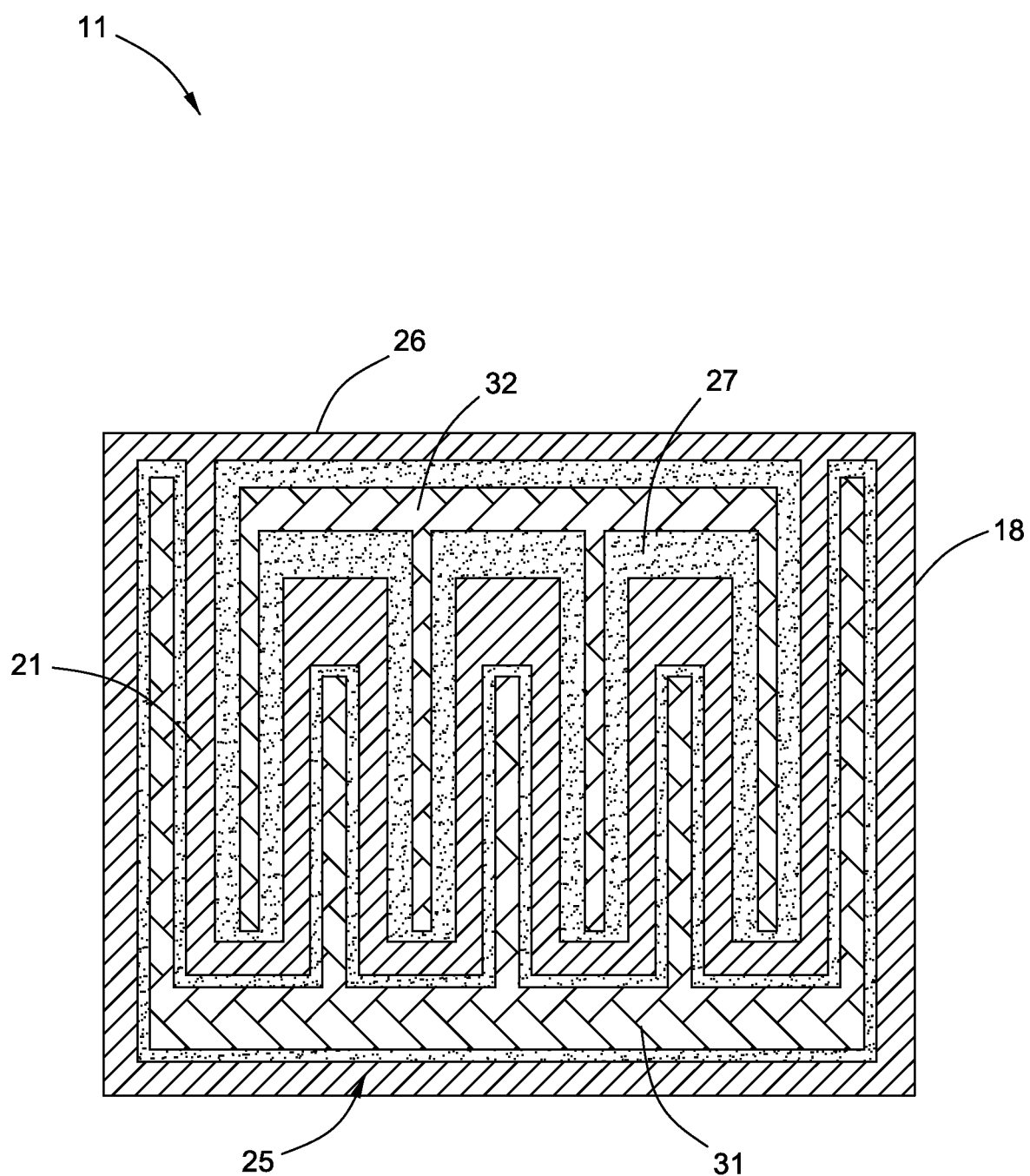
FIG. 3 is a schematic top view of the semiconductor device shown in FIG. 2, in accordance with aspects of the present invention.

FIG. 3 is a schematic top view of the semiconductor device 11 shown in FIG. 2, in accordance with aspects of the present invention. For ease of illustration, the dielectric layer 30 shown in FIG. 2 is not illustrated. As illustrated in FIG. 3, the separation slot 21 is defined between and separates the first and the second portions 23, 24 of the first doped layer 17 from one another. The semiconductor device 11 thus comprises the thyristor unit 25 and the avalanche photodiode unit 26. The anode 29 comprises first and second parts 31, 32 to be electrically connected with the first doped layer 17 of the thyristor unit 25 and the avalanche photodiode unit 26, respectively.

Figure 4:
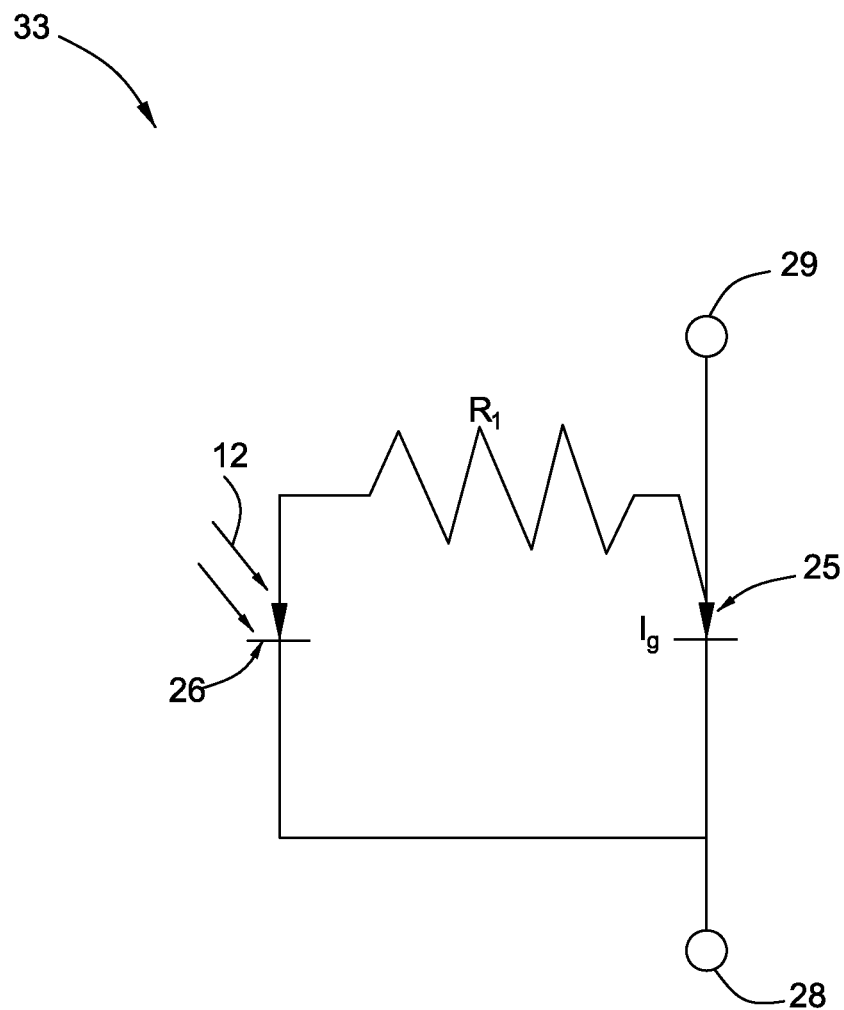
FIG. 4 is a schematic circuit diagram of the semiconductor device shown in FIG. 2.

FIG. 4 is a schematic circuit diagram of the semiconductor device 11 shown in FIG. 2. As illustrated in FIG. 4, a circuit 33 comprises the optical avalanche photodiode unit 26 and the thyristor unit 25 coupled to the avalanche photodiode unit 26 by the resistor R1. The cathode 28 and the anode 29 are coupled with the thyristor unit 25 through the first and the fourth doped layers 17, 20 (shown in FIG. 2) respectively. The thyristor unit 25 controls the flow of the electric current from the anode 29 to the cathode 28.

During operation, the incident light 12 is applied to the avalanche photodiode unit 26 to produce a photoinduced current $I_{PHOTO}$. Due to the amplification of the avalanche photodiode unit 26, the photoinduced current IPHOTO is amplified to produce an electrical current (not shown), which flows out of the avalanche photodiode unit and functions as a gate current IG (the trigger current) for triggering the thyristor unit 25. Once the thyristor unit 25 is in the conductive state, the electric current from the anode 29 flows through the thyristor unit 25 to the cathode 28.

For the arrangements in FIGS. 2 and 3, the thyristor unit 25 and the avalanche photodiode unit 26 are illustrated as being unitary. In other applications, the thyristor unit 25 may be separated from the avalanche photodiode unit 26, and the electric current generated by the avalanche photodiode unit 26 may be directed to the gate terminal of the thyristor unit 25, for example, through an electrical wire.

Figure 5:
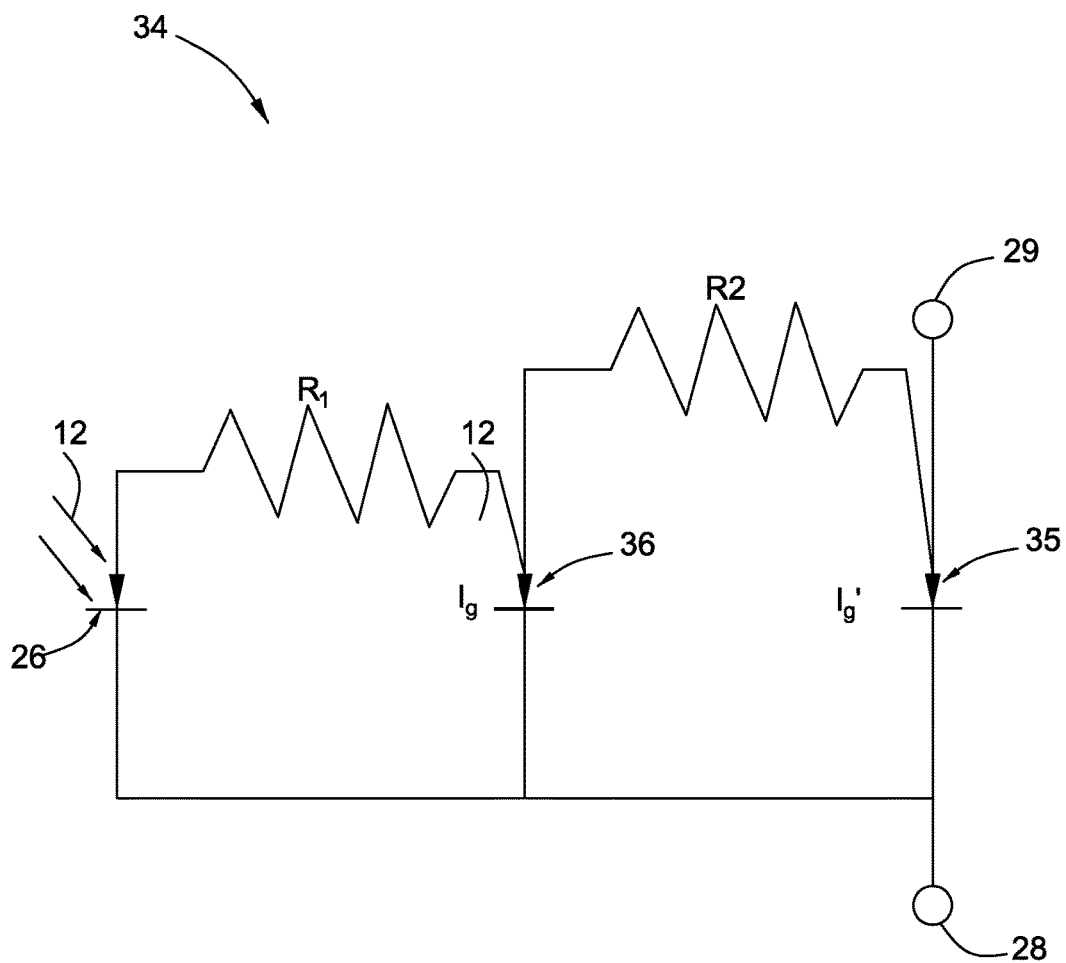
FIG. 5 is a schematic circuit diagram of the semiconductor device, in accordance with aspects of the present invention.

In one non-limiting example, in order to increase the trigger current, as illustrated in FIG. 5, the effective circuit 34 for the semiconductor device 11 may comprise more than one thyristor. For example, the thyristor unit (not labeled) may comprise a first and a second thyristor 35, 36, which are coupled to the avalanche photodiode unit 26. In this example, the first (or a switching) thyristor 35 is configured to switch the electric current from the power source 13 to the load 14 (shown in FIG. 1). The second (or amplifying) thyristor 36 is configured to amplify the electric current from the avalanche photodiode unit 26 and is disposed between the first thyristor 35 and the avalanche photodiode unit 26. Depending on the specific application, the first and the second thyristors 35, 36 and the avalanche photodiode unit 26 may be disposed integrally or separately.

Each of the first and the second thyristor 35, 36 may have a similar configuration as the above-described thyristor unit 25, and include a number of doped wide band-gap semiconductor layers. Typically, the two outer layers of each thyristor 35, 36 are heavily doped layers, while the two inner layers are more lightly doped. Each layer is oppositely doped from the adjacent layer(s). One or both of the inner two layers may act as the gate terminal and be configured to receive the trigger current. Other descriptions of the first and second thyristors 35, 36 can be found, for example, in a U.S. patent application Ser. No. 13/328,796, filed Dec. 16, 2011, "Optically triggered semiconductor device and method for making the same," to Alexey Vert et al, which has the same assignee as this application and the contents of which are hereby incorporated by reference herein in their entirety.

During operation, the incident light 12 is applied to the avalanche photodiode unit 26 to produce a photoinduced current $I_{PHOTO}$. Due to the amplification of the avalanche photodiode unit 26, the photoinduced current $I_{PHOTO}$ is amplified to produce a first gate current (or a trigger current) $I_G$, flowing to the gate of the second thyristor 36 through the resistor $R_1$ to activate the second thyristor 36.

Then, a second gate current (or a second trigger current) $I_G'$, which may be larger than the first gate current $I_G$ due to amplification by the second thyristor 36, flows from the second thyristor 36 to the gate of the first thyristor 35 through the resistor $R_2$ to turn on the first thyristor 35. Once the first thyristor 35 is turned on, the electric current from the anode 29 can flow through the first thyristor 35 to the cathode 28. This beneficially ensures that the first thyristor 35 can be activated when the first thyristor 35 is used in the high voltage and/or high current applications.

In embodiments of the invention, the optically triggered semiconductor device employs the avalanche photodiode unit to trigger the thyristor unit. Compared to conventional optically triggered thyristors, the trigger current generated is greater, which beneficially extends the applications of the thyristor unit. For example, the thyristor unit can also be used in high voltage and/or high current applications. Due to the higher trigger current, the thyristor unit may also be readily triggered.

In addition, the avalanche photodiode unit may be disposed unitarily or separated from the thyristor unit. This beneficially increases the flexibility of the semiconductor device. In some examples, the avalanche photodiode unit and the thyristor unit may be unitary and comprise the common wide band-gap semiconductor body, so that the manufacturing process of such a unitary semiconductor device may be relatively simple, as compared to the manufacturing process of a semiconductor device that which comprises two semiconductor units.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

What is claimed is:

1. A semiconductor device comprising:
an avalanche photodiode unit configured to receive incident light to generate a trigger current and comprising a wide band-gap semiconductor; and
a thyristor unit configured to receive and be activated by the trigger current to an electrically conductive state.

2. The semiconductor device of claim 1, wherein the semiconductor device comprises a semiconductor body which comprises the wide band-gap semiconductor, and wherein the avalanche photodiode unit and the thyristor unit are integrally formed on the semiconductor body.

3. The semiconductor device of claim 2, wherein the thyristor unit comprises a first thyristor and a second thyristor, wherein the avalanche photodiode unit and the first and the second thyristors are integrally formed on the wide band-gap semiconductor body, wherein the avalanche photodiode unit is configured to generate and supply the trigger current to the second thyristor, and wherein the second thyristor is configured to receive and amplify the trigger current to generate a second trigger current to trigger the first thyristor.

4. The semiconductor device of claim 2, wherein the semiconductor body comprises a plurality of doped wide band-gap semiconductor layers, wherein a second and a third of the doped wide band-gap semiconductor layers are disposed between a first and a fourth of the doped wide band-gap semiconductor layers, and wherein the first and a fourth doped wide band-gap semiconductor layers are more heavily doped than the second and the third doped wide band-gap semiconductor layers.

5. The semiconductor device of claim 4, wherein the first and the third doped wide band-gap semiconductor layers are doped with a p-type dopant, and wherein the second and the fourth doped wide band-gap semiconductor layers are doped with an n-type dopant.

6. The semiconductor device of claim 4, wherein the semiconductor body defines a separation slot extending downward through the first doped wide band-gap layer, so as to spatially define the avalanche photodiode unit and the thyristor unit on the wide band-gap semiconductor body.

7. The semiconductor device of claim 6, further comprising a dielectric layer at least partially disposed in the separation slot.

8. The semiconductor device of claim 6, wherein the separation slot extends into the second doped wide band-gap semiconductor layer.

9. The semiconductor device of claim 4, further comprising a cathode and an anode, wherein the cathode is disposed adjacent to the fourth doped wide band-gap semiconductor layer, wherein the anode is disposed adjacent to at least a portion of the first doped wide band-gap semiconductor layer, and wherein the thyristor unit is configured to provide an electrical connection between the anode and cathode when the thyristor unit in the electrically conductive state.

10. The semiconductor device of claim 1, wherein the wide band-gap semiconductor material comprises silicon carbide.

11. The semiconductor device of claim 1, wherein the wide band-gap semiconductor material comprises gallium nitride, gallium phosphide, or aluminum gallium arsenide.

12. A semiconductor device comprising:
a wide band-gap semiconductor body comprising an avalanche photodiode unit and a thyristor unit, the avalanche photodiode unit being configured to receive incident light to generate a trigger current, the thyristor unit being configured to receive and be activated by the trigger current to an electrically conductive state, and the avalanche photodiode unit and thyristor unit being integrally formed on the wide band-gap semiconductor body; and
an anode and a cathode conductively coupled to the wide band-gap semiconductor body, so that an electrical connection is provided between the anode and the cathode when the thyristor unit is in the electrically conductive state.

13. The semiconductor device of claim 12, wherein the wide band-gap semiconductor body comprises a plurality of doped wide band-gap semiconductor layers, wherein a second and a third of the doped wide band-gap semiconductor layers are disposed between a first and a fourth of the doped wide band-gap semiconductor layers, and wherein the first and the fourth doped wide band-gap semiconductor layers are more heavily doped than the second and the third doped wide band-gap semiconductor layers.

14. The semiconductor device of claim 13, wherein the first and third doped wide band-gap semiconductor layers are p-doped layers, wherein the second and the fourth doped wide band-gap semiconductor layers are n-doped layers, and wherein a plurality of semiconductor junctions are formed at interfaces between the first and the second doped wide band-gap semiconductor layers, between the second and the third doped wide band-gap semiconductor layers, and between the third and the fourth doped wide band-gap semiconductor layers.

15. The semiconductor of claim 13, wherein the cathode is disposed adjacent to a bottom surface of the fourth doped wide band-gap semiconductor layer, and wherein the anode is disposed adjacent to an upper surface of the first doped wide band-gap semiconductor layer.

16. The semiconductor device of claim 13, wherein the wide band-gap semiconductor body defines a separation slot extending downward through the first doped wide band-gap semiconductor layer, so as to spatially define the avalanche photodiode unit and the thyristor unit on the wide band-gap semiconductor body.

17. The semiconductor device of claim 16, wherein the separation slot extends into the second doped wide band-gap semiconductor layer.

18. The semiconductor device of claim 12, wherein the thyristor unit comprises a first and a second thyristor, wherein the avalanche photodiode unit is configured to supply the trigger current to the second thyristor, and wherein the second thyristor is configured to receive and amplify the trigger current to generate a second trigger current to trigger the first thyristor.

19. The semiconductor device of claim 12, wherein the wide band-gap semiconductor body comprises silicon carbide.

20. The semiconductor device of claim 12, wherein the wide band-gap semiconductor body comprises gallium nitride, gallium phosphide, or aluminum gallium arsenide.

21. A method for making a semiconductor device, the method comprising:
providing a wide band-gap semiconductor body comprising four doped wide band-gap semiconductor layers each oppositely doped from an adjacent one of the doped wide band-gap semiconductor layers;
defining an avalanche photodiode unit and a thyristor unit on the wide band-gap semiconductor body; and
conductively coupling an anode and a cathode to respective ones of the first and fourth doped wide band-gap semiconductor layers.

22. The method of claim 21, wherein the first and the third doped wide band-gap semiconductor layers are p-doped layers, wherein the second and the fourth doped wide band-gap semiconductor layers are n-doped layers, wherein the second and the third doped wide band-gap semiconductor layers are disposed between the first and the fourth doped wide band-gap semiconductor layers, and wherein a plurality of semiconductor junctions are formed at interfaces between the first and the second doped wide band-gap semiconductor layers, between the second and the third doped wide band-gap semiconductor layers, and between the third and the fourth doped wide band-gap semiconductor layers.

23. The method of claim 21, wherein the defining step further comprises defining a separation slot along the first doped wide band-gap semiconductor layer, so as to spatially define the avalanche photodiode unit and the thyristor unit.

24. The method of claim 21, wherein the wide band-gap semiconductor body comprises silicon carbide.

25. The method of claim 21, wherein the wide band-gap semiconductor body comprises gallium nitride, gallium phosphide, or aluminum gallium arsenide.

* * * * *